(12) United States Patent
Fischl et al.

(10) Patent No.: US 6,204,493 B1
(45) Date of Patent: Mar. 20, 2001

(54) FAULT TOLERANT ELECTRIC CURRENT REGULATOR

(75) Inventors: Robert Fischl, Moorestown, NJ (US); Chikaodinaka Nwankpa, Philadelphia, PA (US); Ayre Rosen, Cherry Hill, NJ (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 09/138,224

(22) Filed: Aug. 21, 1998

(51) Int. Cl.$^7$ ........................................................ G01J 1/32

(52) U.S. Cl. ........................ 250/205; 361/91.4; 361/91.8; 363/54

(58) Field of Search ................................. 250/205, 221, 250/206, 578.1; 361/91.8, 91.4, 88, 89, 93.1, 94; 363/54, 50; 259/187; 315/154, 156, 158, 159

(56) References Cited

U.S. PATENT DOCUMENTS

| | | |
|---|---|---|
| 4,403,139 | 9/1983 | De Loach, Jr. ............... 250/205 |
| 4,489,372 | 12/1984 | Hatano et al. ............... 363/54 |
| 4,536,816 * | 8/1985 | Matsumura et al. ............... 361/91.8 |
| 4,572,947 * | 2/1986 | Kao et al. ............... 257/118 |
| 4,700,284 | 10/1987 | Yoshizumi et al. ............... 363/68 |
| 4,719,551 | 1/1988 | Nishizawa et al. ............... 363/41 |
| 5,019,769 | 5/1991 | Levinson ............... 372/31 |
| 5,241,414 | 8/1993 | Giles et al. ............... 359/341 |
| 5,278,688 | 1/1994 | Blauvelt et al. ............... 359/125 |
| 5,434,772 | 7/1995 | Itoh ............... 363/96 |

OTHER PUBLICATIONS

George Rost et al., A New Fault Tolerant Semiconductor Laser Triggering System for Light Trigger Thyristors, EPE97 Conference Proceedings, Trondhein, Norway, Sep. 8, 1997, pp. 4.078–4.081.

Andes Aberg, Light Triggered Thyristors for Power Transmission Systems (High Voltage DC Transmission), *Modern Power Systems*, v10, n5, May, 1990, p. 19(2).

B.E. Danielsson, HVDC Valves with Light–Triggered Thyristors, *Plenum Press*, New York, 1992, pp. xiii+393.

S. Nakatsuka et al., High Power ALGaAs Broad Area Laser Diodes for Light Triggered Thyristor Valve System, *Proceedings of the SPIE*, vol. 1043, 1989, pp. 107–110.

* cited by examiner

*Primary Examiner*—Que T. Le
*Assistant Examiner*—Thanh X. Luu
(74) *Attorney, Agent, or Firm*—Akin, Gump, Strauss, Hauer & Feld, L.L.P.

(57) ABSTRACT

The present invention is a fault tolerant apparatus for regulating the flow of electricity. The apparatus comprises a light radiating circuit which includes a first light source for radiating a first light signal, a second light source for radiating a second light signal and a first light sensor for receiving at least one of the first and second light signals and for generating a first light sensor output signal in response to the first and second light signals. The radiating circuit further includes a control circuit for actuating the first light source to radiate the first light signal when the control circuit receives a control input signal and for actuating the second light source to radiate the second light signal when the control circuit fails to receive the first light sensor output signal from the first light sensor within a predetermined time after the control circuit has received the control input signal. The fault tolerant apparatus further comprises a light controlled device having a light sensitive input for receiving one of the first and second light signals and for regulating the flow of electricity light through the controlled device in response to one of the first and second light signals.

16 Claims, 3 Drawing Sheets

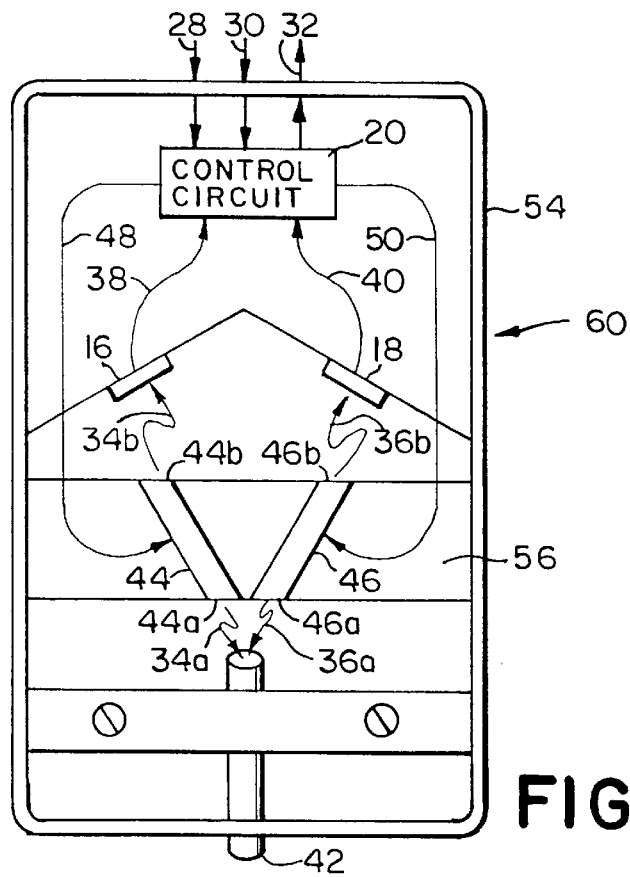
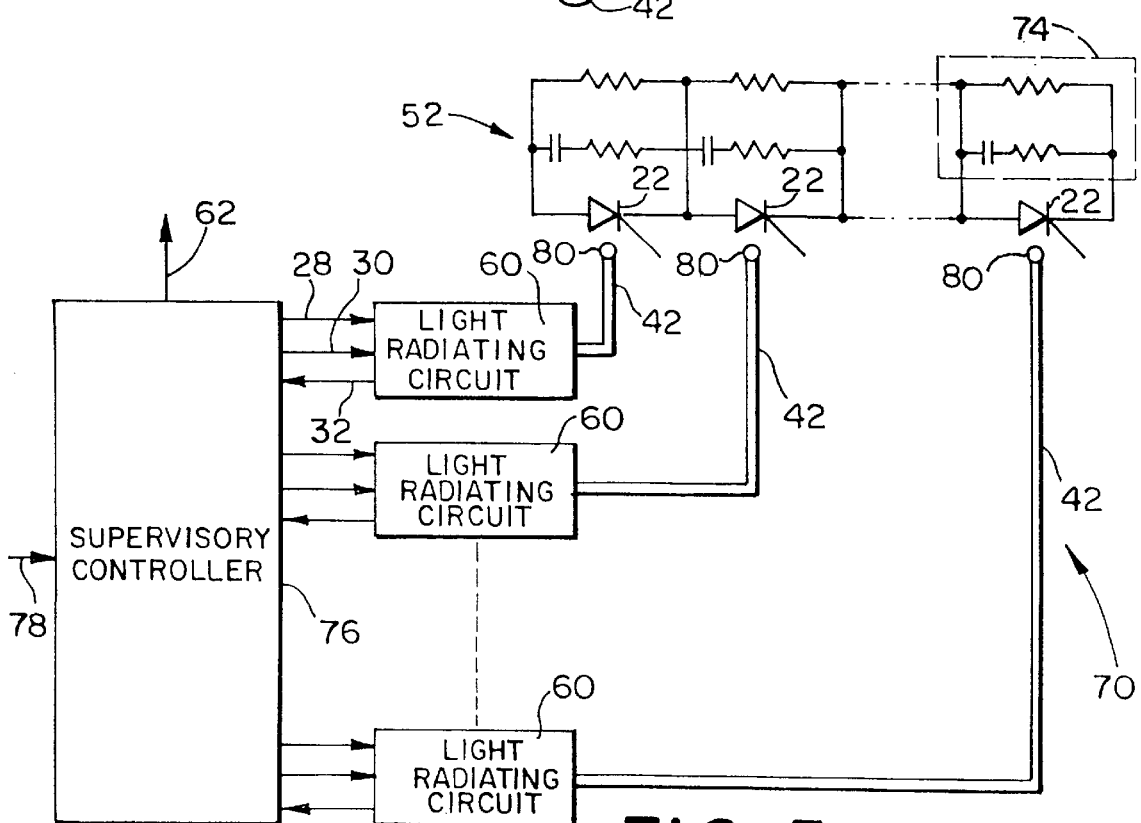
FIG. 4
FIG. 5

FAULT TOLERANT ELECTRIC CURRENT REGULATOR

BACKGROUND OF THE INVENTION

The present invention relates generally to an apparatus for regulating the current flow in an electric circuit and more specifically to a fault tolerant apparatus for regulating the current flow in an electric circuit in which optical coupling is used between the regulating apparatus and the regulated electric circuit.

AC/DC converters/ inverters used in high voltage direct current (HVDC) transmission systems operate at hundreds of kilovolts above ground. These converter/inverters use thyristors as regulating elements. The thyristors are connected in series/parallel arrangements in order to reliably switch the large voltages/currents involved. Light triggered thyristors and optical coupling between the thyristor control system and the thyristors provide the required electrical isolation between the converter/inverter circuits and the thyristor control circuits.

If a single thyristor in a series string of thyristors fails to conduct (fire) when triggered by the control circuits, the result is a very high voltage buildup across the mis-fired thyristor which can cause the mis-fired thyristor to fail. Similarly, a misfired thyristor in a parallel combination results in excessive current in the remaining paralleled thyristors. A single failed thyristor increases the stress on each other thyristor of the thyristor series/parallel combination and could result in total converter/inverter failure. Snubber circuits are used in converter/inverter systems to protect thyristors from damage due to voltage and current transients resulting from misfiring. However, it is desirable to prevent the misfiring from occurring, because even with snubber circuits, the additional stress placed on the thyristor by mis-firing can lead to deterioration of the thyristor and premature failure. Hence, the reliability of the optical source for providing a reliable optical triggering signal is of great importance for such switching devices, particularly when used in extremely high voltage circuits.

At the present time the main source of HVDC converter/inverter system failures using light triggering of thyristors is the light source itself. The majority of HVDC converter/inverter systems currently deployed use cesium lamp light sources for triggering converter/inverter thyristors. Cesium light sources are bulky and require the lamp to be always on, producing an undesired source of background light. Moreover, cesium lamps provide a large spectrum of light that is not fully used by the thyristor. The introduction of laser diodes as light sources has assuaged some of the problems resulting from use of the cesium light source but laser diodes still present a reliability issue in the total HVDC system design.

Accordingly there is a need for a light triggered thyristor apparatus which reduces the occurrence of thyristor mis-firing and is reliable, modular, small in size, low in cost and not excessive in power dissipation.

BRIEF SUMMARY OF THE INVENTION

The present invention is a fault tolerant apparatus for regulating the flow of electricity. The apparatus comprises a light radiating circuit which includes a first light source for radiating a first light signal, a second light source for radiating a second light signal and a first light sensor for receiving at least one of the first and second light signals and for generating a first light sensor output signal in response to the first and second light signals. The radiating circuit further includes a control circuit for actuating the first light source to radiate the first light signal when the control circuit receives a control input signal and for actuating the second light source to radiate the second light signal when the control circuit fails to receive the first light sensor output signal from the first light sensor within a predetermined time after the control circuit has received the control input signal. The fault tolerant apparatus further comprises a light controlled device having a light sensitive input for receiving one of the first and second light signals and for regulating the flow of electricity through the light controlled device in response to one of the first and second light signals.

Another aspect of the present invention is a fault tolerant regulating system for regulating the flow of electricity. The system comprises a plurality of light radiating circuits each radiating circuit comprising first and second light sources for radiating first and second light signals and a first light sensor for receiving the first light signal and for generating a first light sensor output signal in response to the first light signal. The radiating circuit also includes a control circuit for actuating the first light source to radiate the first light signal when the control circuit receives a control input signal and for actuating the second light source to radiate the second light signal when the control circuit fails to receive the first light sensor output signal from the first light sensor within a predetermined time after the control circuit has received the control input signal. The regulating system further includes a plurality of light controlled devices each connected for receiving the first and second light signals from the light radiating circuits and for regulating the flow of electricity through the light controlled devices, and a supervising controller connected to each light radiating circuit for providing the control signals to each light radiating circuit.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings:

FIG. 4 is a plan view of a radiating circuit in accordance with a preferred embodiment of the present invention;

FIG. 5 is a block diagram of a fault tolerant system for regulating the flow of electricity in accordance with a preferred embodiment of the present invention.

DETAILED DESCRIPTION OF THE INVENTION

Figure 1:
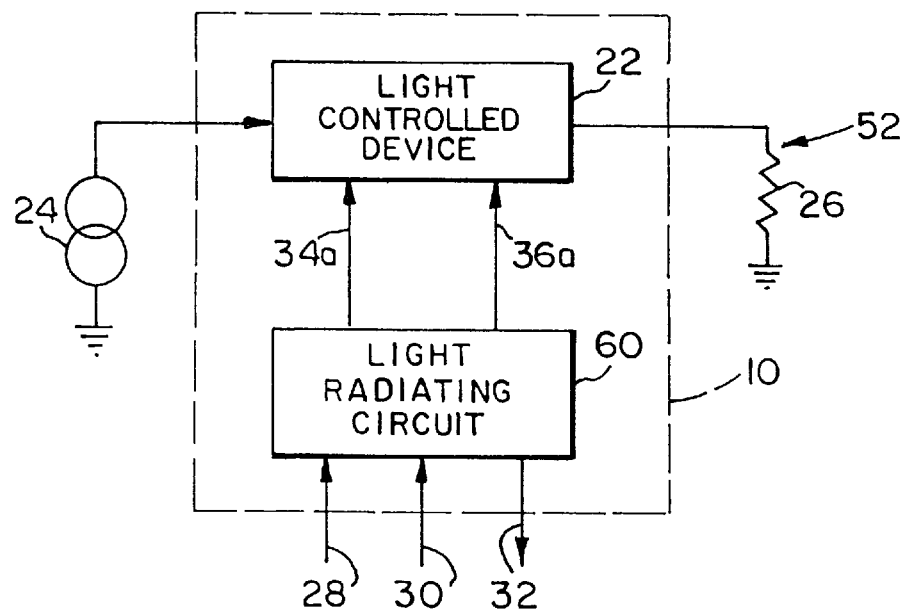
FIG. 1 is a a functional schematic block diagram of a preferred embodiment of a fault tolerant apparatus for regulating the flow of electricity in accordance with a preferred embodiment of the present invention.

Referring to the drawings in detail where like numerals are used to indicate like elements throughout there is shown in FIG. 1 a preferred embodiment of a fault tolerant apparatus 10 for regulating the flow of electricity in a controlled electrical circuit 52 in accordance with the present invention. The electrical circuit 52 is typically a circuit for which electrical isolation of the regulating apparatus 10 from the electrical circuit 52 is desired, such as a high voltage direct current (HVDC) transmission system where the voltage potential of the circuit 52 may be several hundred thousand volts above ground potential. However, the electrical circuit 52 is not limited to any particular kind of end use. One skilled in the art will recognize that the electrical circuit 52 may be of any kind in which there is a voltage or current source 24 and a power consuming load 26, whether it be alternating current or direct current, and whether voltage or current regulation of the electrical circuit is desired to a predetermined level of voltage or current, without departing from the spirit and scope of the invention.

Figure 2:
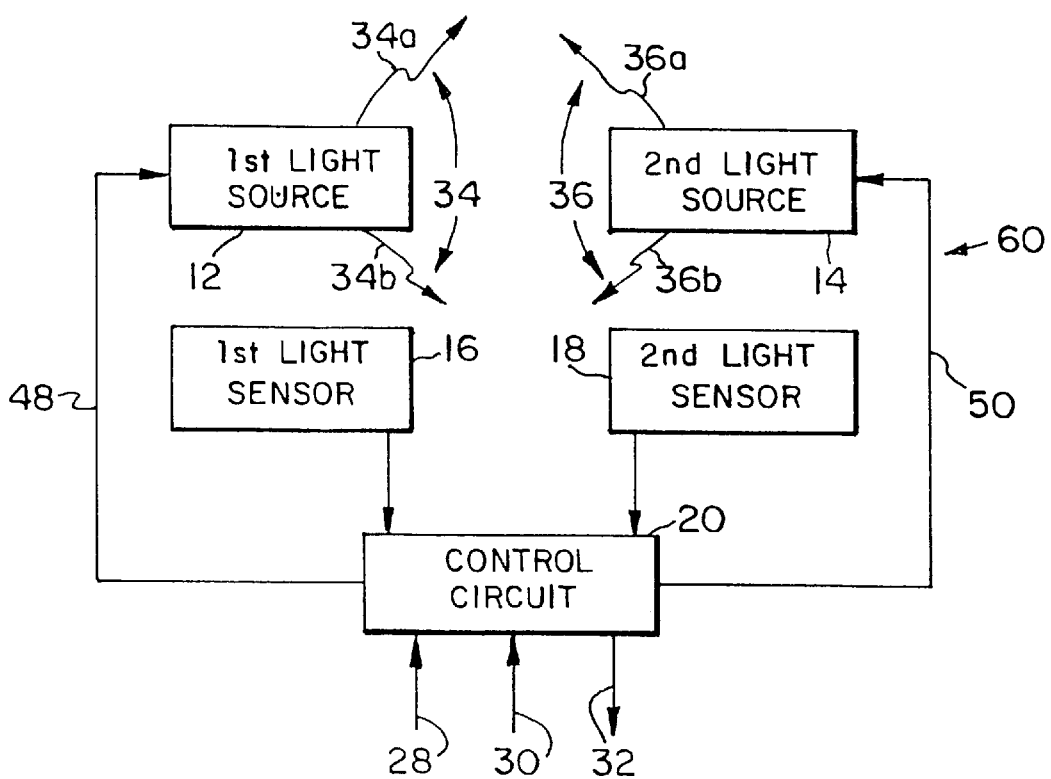
FIG. 2 is a functional schematic block diagram of a radiating circuit.

Referring now to FIGS. 1 and 2, the fault tolerant apparatus 10 includes a light radiating circuit 60 comprising a first light source 12 and a second light source 14 for radiating respectively a first light signal 34 including directional components 34a and 34b and a second light signal 36 including directional components 36a and 36b. In the preferred embodiment of the fault tolerant apparatus 10, the light sources 12, 14 are continuous wave laser diodes. However, one skilled in the art will recognize that it is not necessary to employ laser diodes as the light sources 12, 14 and that other kinds light sources 12, 14 which are capable of being energized electrically may be employed to radiate the first and second light signals 34, 36. For example, light emitting semiconductor diodes, gas discharge devices and thermionic devices may be employed as light sources 12, 14 without departing from the spirit and scope of the invention.

The fault tolerant apparatus 10 also includes a first light sensor 16 for receiving the first and second light signals 34, 36 and for generating a first light sensor output signal 38 in response to the receipt of at least one of the first and second light signals 34, 36. Preferably, the first light sensor 16 receives only the first light signal 34. In the preferred embodiment, shown in FIG. 2, the fault tolerant apparatus 10 further comprises a second light sensor 18 for receiving the second light signal 36 and for generating a second light sensor output signal 40 in response to receiving the second light signal 36.

In the preferred embodiment, the first and second light sensors 16, 18 are photo-diodes and are of a type well known to those skilled in the art. The photodiodes are electrically biased in a manner well known to known to one skilled in the art so that the current flow in the diodes is proportional to the optical power received by the photo-diodes. It will be appreciated by one skilled in the art that the means for generating the first and second light sensor output signals 38, 40 are not limited to photo-diodes. Other types of light sensors which have a measurable electrical characteristic related to the magnitude of the incident light, such as photo-conductors, may be employed to generate the first and second light sensor output signals 38, 40 without departing from the spirit and scope of the invention.

Figure 3:
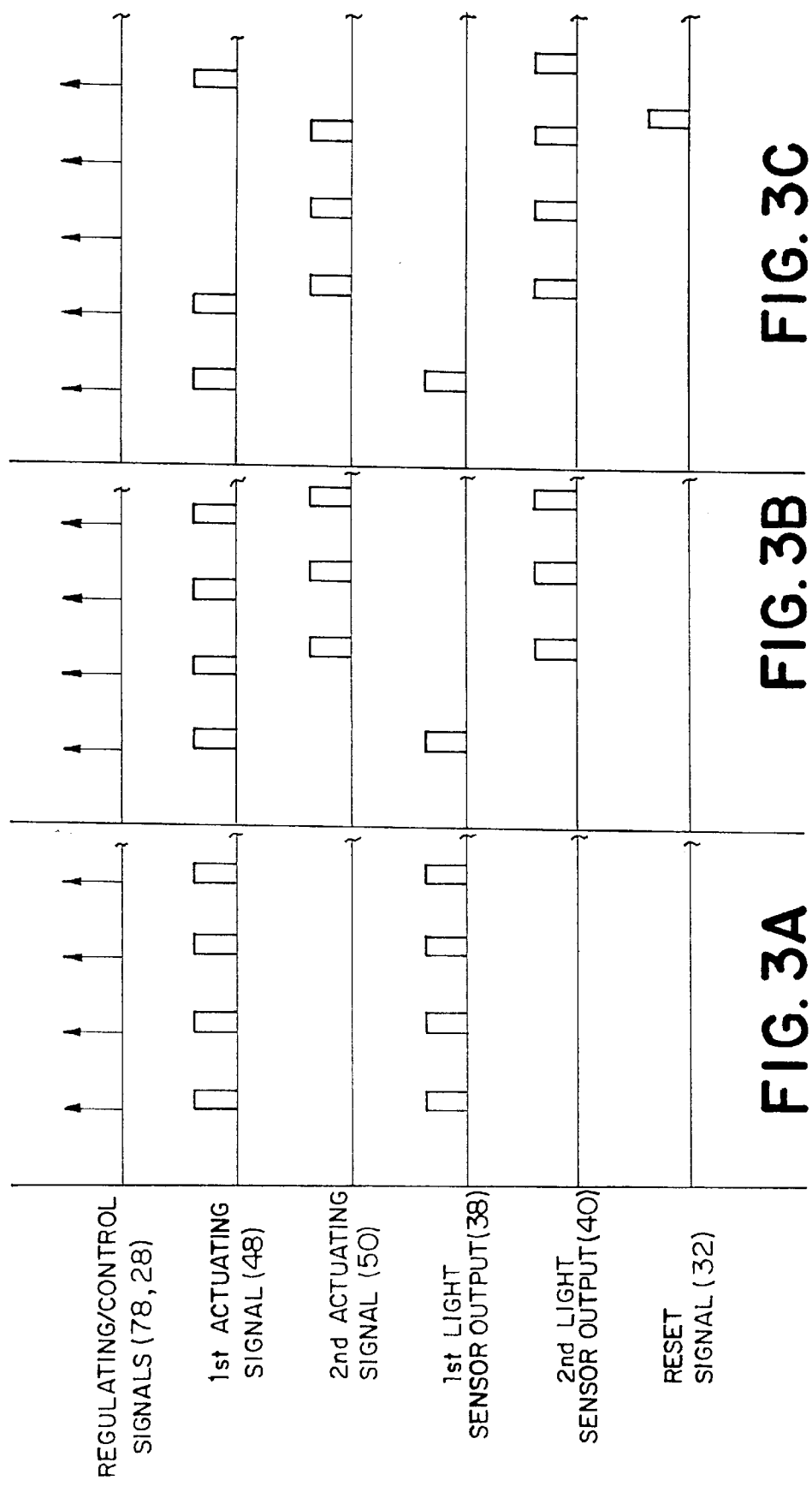
FIG. 3a is a timing diagram illustrating the relationship between a control input signal and a light radiating circuit in which the first light source operates normally.
FIG. 3b is a timing diagram illustrating the relationship between a control input signal and a light radiating circuit in which a failed first light source is actuated each time the control circuit is actuated.
FIG. 3c is a timing diagram illustrating the relationship between a control input signal and a light radiating circuit in which a failed first light source is not actuated until a reset signal is input to the radiating circuit.

Referring again to FIG. 2 there is, in the preferred embodiment of the fault tolerant apparatus 10, a control circuit 20, for actuating the first light source 12 to radiate the first light signal 34 when the control circuit 20 receives a control input signal 28. In the preferred embodiment of the fault tolerant apparatus 10, the control circuit 20 generates a first actuating signal 48 each time a control input signal 28 is received, as shown in FIG. 3a. The first actuating signal 48 actuates the first light source 12 causing the first light source 12 to radiate the first light signal 34. When the first light signal 34 is detected by the first light sensor 16, the first light sensor 16 generates the first light sensor output signal 38. The control circuit 20 compares magnitude of the first light sensor output signal 38 to a predetermined magnitude stored in the control circuit 20, and if the first light sensor output signal 38 exceeds the predetermined magnitude within a predetermined time compared to the time of occurrence of the control input signal 28, the first light source is determined to be in operable condition. However, as shown in FIG. 3b, if the control circuit 20 fails to receive the first sensor output signal 38 having a magnitude greater than a predetermined magnitude and within a predetermined time after the control circuit 20 has received the control input signal 28 the control circuit 20 determines the first light source 12 to be defective or inoperable and generates second actuating signal 50 to cause the second light source 14 to radiate a second light signal 36. The second light source sensor 18 detects the second light signal 36 and generates the second light sensor output signal 40 which is supplied to the control circuit 20 to confirm the operability of the second light source 14.

Referring now to FIGS. 3b and 3c one skilled in the art will recognize that (as shown in FIG. 3b) the control circuit 20 may be designed to actuate the first light source 12 each time the control circuit 20 receives a control input signal 28 regardless of whether the first light source 12 has been determined to be inoperable and the second light source 14 has been previously actuated. Alternatively, (as shown in FIG. 3c) the control circuit 20 may be designed to inhibit actuation of the first light source 12 after the second light source 14 has been actuated until after a reset signal 30 is received by the control circuit 20.

In the preferred embodiment the control circuit 20 is an integrated circuit comprising a conventional microprocessor, analog and digital circuits and transistor or other solid state switches well known in the art, for actuating the first and second light sources 12, 14. It is preferred that the switches (not shown) for actuating the first and second light sources 12, 14 be high speed HEXFETs. However, one skilled in the art will recognize that the control circuit 20 and the light source 12, 14 switches may be implemented by many different combinations of hardware and software and still be within the spirit and scope of the invention. One skilled in the art will also recognize that it is within the spirit and scope of the invention to package multiple sets of light sources 12, 14 and light sensors 16, 18 within a single package. In such a configuration a single control circuit 20 could be used to control a plurality of light source 12, 14 and light sensor 16, 18 pairs and still be within the spirit and scope of the invention.

In the preferred embodiment of the fault tolerant apparatus 10, the control circuit 20 also generates a diagnostic signal 32 indicative of the operability status the first and second light sources 12, 14 and based on receiving the first and/or second light sensor output signals 38, 40. The diagnostic signal 32 indicates a failure of a respective light source 12, 14 if the either of the respective first or second light sources 12, 14 fails to radiate a predetermined magnitude of light in response to the most current control input signal 28. In the preferred embodiment, the diagnostic signal 32 is constituted as a two bit digital representation of the status of the first and second light sources 12, 14 and is updated a predetermined time following each receipt of the control input signal 28 by the control circuit 20. One skilled in the art will recognize that the diagnostic signal 32 may be a different digital or analog representation of the status of the first and/or second light sources 12, 14 without departing from the spirit and scope of the invention. Also, the diagnostic signal 32 may constitute different information about the radiating circuit 60. For example, the diagnostic signal 32 may be constituted to include information on the magnitude and time of occurrence of each of the first and second light sensor output signals 38, 40 without departing from the spirit and scope of the invention.

As seen in FIG. 1 there is a light controlled device 22 having a light sensitive input for receiving the first and second light signals 34, 36 from the first and second light sources 12, 14 and for regulating the flow of electricity through the light controlled electrical device 22. In the preferred embodiment of the fault tolerant apparatus 10 the light controlled device 22 is a light triggered thyristor. In the preferred embodiment, a pulse of light 34, 36 from the first light source 12 or second light source 14 at an optical power level larger than a predetermined threshold level is radiated into the light triggered thyristor 22 when the light triggered thyristor 22 is forward biased thus causing the light triggered thyristor 22 to conduct electricity in the positive direction between the voltage source 24 and the load 26 of an electrical circuit 52 while the voltage source 24 is of a positive polarity. It will be appreciated by those skilled in the art that by varying the time relationship between the onset of the first and second light signals 34, 36 and the occurrence of positive polarity of the source voltage 24, regulation of the electric current flowing through the load 26 may be achieved. It will be appreciated by one skilled in the art that light controlled devices other than a light triggered thyristor 22 may be employed to perform regulation of the electrical circuit 52 without departing from the spirit and scope of the invention. For example, a photo-conductor (not shown) such as made from PbS may be employed and the regulation of the electrical circuit 52 may be achieved by varying the conductance of the PbS photo-conductor in response to the magnitude of the first and second light signals 34, 36. Similarly, photo-diodes or photo-transistors which modulate the current in the circuit 52 in response to the magnitude of the first and second light signals 34, 36 may be employed as regulating devices without departing from the spirit and scope of the invention.

There are included in the preferred embodiment of the fault tolerant apparatus 10, shown in FIG. 4, a light radiating circuit 60 comprising first and second laser diodes 44, 46, first and second light sensors 16, 18 and a light guide 42 packaged together in a small convective heat sink 54, for triggering a light triggered thyristor 22, in which only one laser diode 44, 46 fires under normal operating conditions. The laser diodes 44, 46 are placed on a laser bar 56 and soldered to the heat sink assembly 54. The laser bar material 56, whose trade name is Thermkon, is selected for it's high conductivity and it's close match in thermal expansion to other components. As shown in FIG. 4, the two laser diodes 44, 46 are positioned so that they both shine light into a single light guide 42. However, as can be appreciated by one skilled in the art, the laser diodes 44, 46 may be positioned so that they shine light into two light guides 42 (not shown). Further, multiple sets of laser diodes 44, 46, light sensors 16, 18 and light guides 42 (not shown) may be included in a single heat sink package 54 for controlling multiple light controlled devices 22, within the spirit and scope of the invention.

In the preferred embodiment of the fault tolerant apparatus 10, the laser diodes 44, 46 each have a front facet 44a, 46a for radiating the first and second front light signals 34a, 36a to the light controlled device 22 and a back facet 44b, 46b for radiating the first and second back light signals 34b, 36b to the first and second light sensors 16, 18 respectively. In the preferred embodiment the first and second back light signals 34b, 36b are approximately 10% of the total light generated by each laser diode 44, 46. The light sensors 16, 18 can not only detect a failure of the laser diodes 44, 46 but can also measure degradation of the laser diodes 44, 46.

It is preferred that the laser diodes be continuous wave lasers fabricated from a separate confinement heterostructure containing a single quantum well and capable of emitting an average optical power of one watt at a wavelength of 810 nanometers. In use, the laser diodes are operated at 1/10th of their power output capability. The low power level compared to the laser diodes 44, 46 power output capability extends the useful life of the laser diodes 44, 46 and allows for natural convective cooling of the heat sink 54 in contrast to more complex forced air or liquid cooling, but is sufficient to provide in excess of 10 milliwatts of optical power at the distal end of a light guide 42 for triggering a light triggered thyristor 22. As will be appreciated by one skilled in the art, the invention is not limited to any particular kind of laser diodes 44, 46 or operation of the laser diode 44, 46 at any particular power level. Any type of laser diode 44, 46 whose optical wavelength and output power level are compatible with the light guide 42 and light controlled device 22 may be employed within the spirit and scope of the invention.

The preferred embodiment of the fault tolerant apparatus 10 further includes a light guide 42 for transmitting light from the first and second light sources 12, 14 to the light controlled device 22. In the preferred embodiment the light guide 42 is a single optical fiber for receiving light from both the first and second laser diodes 44, 46. However, as will be appreciated by one skilled in the art, the light guide 42 is not restricted to a single fiber and may be multiple fibers arranged to receive light individually from the first and second laser diodes 44, 46 and be within the spirit and scope of the invention. It will also be appreciated that two or more light guides 42 (one from each laser diode 44, 46) may be employed and that the light guide(s) 42 may comprise something other than optical fibers(s).

The preceding paragraphs have described a fault tolerant apparatus 10 for regulating the flow of electricity in which a single light controlled device 22 is used as the sole means for regulating an electric circuit 52. The fault tolerant apparatus is not limited to those applications in which only a single device is used for electric circuit regulation but rather, is particularly well suited to applications having a plurality of regulating devices required to regulate extremely large currents, voltages or both.

In FIG. 5 there is shown a fault tolerant regulating system 70 for regulating the electric circuit 52 representing one phase of a multi-phase thyristor converter apparatus. (Since all phases are identical only one phase is shown). The regulation is performed by a series connection of a plurality of light triggered thyristors 22, each light triggered thyristor 22 being combined with a parallel connected snubber circuit 74. The design of converter circuits employing light triggered thyristors 22 and snubber circuits 74 is well known in the art of high voltage direct current transmission system and for the sake of brevity a full description is not repeated here. One skilled in the art will recognize that the thyristors 22 may be arranged in a variety of series, parallel and series/parallel arrangements to meet a variety of voltage and current handling requirements and be within the spirit and scope of the invention. Further, one skilled in the art will recognize that the application of the fault tolerant regulating system 70 is not limited to high voltage transmission systems. For example, the concept of the fault regulating system 70 could be applied to high current power supply systems where a plurality of light triggered thyristors 22 are configured in parallel without departing from the spirit and scope of the invention.

In the application of the fault tolerant apparatus 10 to the fault tolerant regulating system 70, simultaneous pulses of light are provided to the light triggered thyristors 22 by a plurality of light radiating circuits 60 and light guides 42. The light radiating circuits 60, light triggered thyristors 22 and the light guides 42 have the characteristics of the light radiating circuits 60, light triggered thyristors 22 and the light guides 42 previously described. Consequently and for the sake of brevity, these characteristics are not repeated.

The regulating system 70 further comprises a supervising controller 76 connected to each light radiating circuit 60 for: (1) providing a control input signal 28 to each light radiating circuit 60 based on receiving a regulation signal 78; (2) receiving the diagnostic signal 32 from each radiating circuit 60; (3) maintaining the operability status of each radiating circuit 60 determined by monitoring the diagnostic signal 32 generated by each light radiating circuit 60; and (4) generating the reset signal 30 to each radiating circuit 60.

In use the preferred embodiment of the fault tolerant regulating system 70 receives a regulating signal 78 from an external electric control system (not shown) for generating the plurality of thyristor triggering signals 80 at the distal end of each light guide 42. The regulating controller 76 generates a control input signal 28 to each radiating circuit 60 each time a regulating signal 78 is received. Upon receiving a control input signal 28, the control circuit 20 of each radiating circuit 60 generates a first actuation signal 48 which in normal operation causes the first light source 12 to generate a first light signal 34, which becomes the triggering signal 80 for a respective light triggered thyristor 22 via a respective light guide 42. If the control circuit 20 fails to receive a first light sensor output signal 38 within a predetermined time, which is typically less than 10 microseconds from the onset of the first actuation signal 48, the control circuit 20 generates a second actuation signal 50 to cause the second light source 14 to generate the second light signal 36 for transmission to the respective light triggered thyristor 22. In this manner a failure of the first light source 12 will not result in a mis-fired light triggered thyristor 22.

Within a predetermined time following receipt of each control input signal 28 by each radiating circuit 60, the control circuit 20 of each radiating circuit 60 generates a diagnostic signal 32 which provides the operability status of the first and second light sources 12, 14 to the supervising controller 76 as previously described. In the preferred embodiment, the status of the first and second light sources 12, 14 is stored in the supervising controller memory (not shown). The status of the first and second light sources 12, 14 is processed by the supervising controller to generate a radiating circuit status 62 which is displayed to an operator for maintenance purposes. In accordance with the preferred embodiment, the radiating circuit status 62 of a particular radiating circuit 60 indicates whether the first and second light sources 12, 14 are operable, inoperable or unknown, preferably on a color video display. (The operability of a light source may be undetermined if it has not been previously actuated).

In the preferred embodiment a reset signal 30 is generated if the diagnostic signal 32 received by the supervising controller indicates a light source 12, 14 failure, as previously described, on two successive control input signal 28 transmissions. If the light source status again indicates a failure after two successive control input signal 28 transmissions following a reset signal 30, the light source 12, 14 is considered inoperable. However, as can be appreciated by one skilled in the art many other criteria may be selected for establishing the radiating circuit status 62 and still be within the spirit and scope of the invention. Further, as will be appreciated by one skilled in the art, the display of the radiating circuit status 62 can take different forms and display different results depending on the application. For example, the average magnitude and time of occurrence of the first and second light sensor output signals 38 and 40 could be displayed within the spirit and scope of the invention.

In the preferred embodiment of the regulating system 70, the supervising controller 76 is a personal computer and color video display of commercially available design well known to those skilled in the art. The supervising controller 76 employs commercially available input/output devices also well known to those skilled in the art to transmit the control input signal 28 and reset signal 30 to the radiating circuits 60 and to receive the regulating signal 78 and the diagnostic signals 32. However, as can be appreciated by one skilled in the art, the supervising controller 76 could be constructed using a wide variety of contemporary components and software and still be within the spirit and scope of the invention.

From the foregoing description, it can be seen that the apparatus for regulating an electric circuit 10 overcomes the problem of mis-fired light sensitive thyristors by providing a second light source which automatically triggers the light sensitive thyristor when the first light source fails to radiate the triggering light pulse within a prescribed time. The apparatus for regulating an electric circuit is inherently reliable, modular, small in size and low in cost lending itself to applications requiring a large number of the apparatus for control of a plurality of light sensitive devices.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A fault tolerant apparatus for regulating the flow of electricity comprising:
   a light radiating circuit, the radiating circuit comprising;
   a first light source for radiating a first light signal,
   a second light source for radiating a second light signal,
   a first light sensor for receiving at least one of the first and second light signals and for generating a first light sensor output signal in response thereto, and
   a control circuit for pulsing only the first light source to radiate the first light signal for a first predetermined time each time the control circuit receives a control input signal and thereafter pulsing only the second light source to radiate the second light signal for the first predetermined time only as a consequence of the control circuit failing to receive the first light sensor output signal within a second predetermined time after the control circuit has received the control input signal, wherein the first light source is pulsed subsequent to the control circuit failing to receive the first light sensor output signal after the first light source has been pulsed; and a light controlled device having a light sensitive input for receiving one of the first and second light signals and for regulating the flow of electricity through the light controlled device in response thereto.

2. The fault tolerant apparatus according to claim 1, wherein instead of pulsing the first light source subsequent to the control circuit failing to receive the first light sensor output signal after the first light source has been pulsed, the first light source is not further pulsed subsequent to the control circuit failing to receive the first light sensor output signal after the first light source has been pulsed until after a reset signal is provided to the control circuit.

3. The fault tolerant apparatus according to claim 1 wherein a light guide transmits light from the first and second light sources to the input of the light controlled device.

4. The fault tolerant apparatus according to claim 1 wherein the light controlled device is a thyristor.

5. The fault tolerant apparatus according to claim 1 further including a second light sensor for receiving the second light signal and for generating a second light sensor output signal in response thereto.

6. The fault tolerant apparatus according to claim 5 wherein the control circuit generates a diagnostic signal based on at least one of the first light sensor output signal and the second light sensor output signal.

7. The fault tolerant apparatus according to claim 5 wherein the first and second light sources each comprise a laser diode having a front facet for radiating light to the light controlled device and a back facet for radiating light to at least one of the first light sensor and the second light sensor.

8. The fault tolerant apparatus of claim 7 wherein the light radiating circuit operates with natural convection cooling.

9. A fault tolerant regulating system for regulating the flow of electricity comprising:

a plurality of light radiating circuits, each radiating circuit comprising first and second light sources for radiating first and second light signals, a first light sensor for receiving the first light signal and for generating a first light sensor output signal in response thereto, and a control circuit for pulsing only the first light source to radiate the first light signal for a first predetermined time each time the control circuit receives a control input signal and thereafter pulsing only the second light source to radiate the second light signal for the first predetermined time only as a consequence of the control circuit failing to receive the first light sensor output signal from the first light sensor within a second predetermined time after the control circuit has received the control input signal, wherein the first light source is pulsed subsequent to the control circuit failing to receive the first light sensor output signal after the first light source has been pulsed;

a plurality of light controlled devices each connected for receiving the first and second light signals from the light radiating circuits and for regulating the flow of electricity through the light controlled devices; and a supervising controller connected to each light radiating circuit for providing the control input signal to each light radiating circuit and maintaining an operability status of each radiating circuit.

10. The regulating system according to claim 9 wherein instead of pulsing the first light source subsequent to the control circuit failing to receive the first light sensor output signal after the first light source has been pulsed, the first light source of each respective radiating circuit is not further pulsed subsequent to the respective control circuit failing to receive the respective first light sensor output signal after the respective first light source has been pulsed until after the reset signal has been provided to the respective control circuit.

11. The regulating system according to claim 9 wherein a light guide transmits light from each radiating circuit to at least one of the light controlled devices.

12. The regulating system according to claim 9 wherein the light controlled device is a thyristor.

13. The regulating system according to claim 9, each radiating circuit further comprising a second light sensor for receiving the second light signal and for generating a second light sensor output signal in response thereto.

14. The regulating system according to claim 13 wherein each radiating circuit generates a diagnostic signal based on at least one of the first light sensor output signal and second light sensor output signal.

15. The regulating system according to claim 14 wherein the supervising controller generates the control input signal for input to each light radiating circuit based on receiving a regulation signal and generates a reset signal for input to each light radiating circuit based on the diagnostic signal received from each respective light radiating circuit.

16. The regulating system according to claim 13 wherein the first and second light sources each comprise a laser diode having a front facet for radiating light to a fiber optic light guide and a back facet for radiating light to at least one of the first light sensor and the second light sensor.

\* \* \* \* \*